United States Patent [19]

Boland

[11] 4,430,611

[45] Feb. 7, 1984

[54] FREQUENCY SPECTRUM ANALYZER WITH PHASE-LOCK

[75] Inventor: Thomas J. Boland, Idaho Falls, Id.

[73] Assignee: The United States of America as represented by the United States Department of Energy, Washington, D.C.

[21] Appl. No.: 288,234

[22] Filed: Jul. 29, 1981

[51] Int. Cl.³ ............................................. G01R 23/16
[52] U.S. Cl. ............................... 324/77 C; 324/77 B
[58] Field of Search ................. 324/77 R, 77 B, 77 C, 324/77 CS, 77 G, 77 K, 79 R; 375/111, 116

[56] References Cited

U.S. PATENT DOCUMENTS

| | | | |
|---|---|---|---|
| 3,344,350 | 9/1967 | Stoff | 324/77 B |
| 3,643,126 | 2/1972 | Hay | 324/77 C |
| 3,891,920 | 6/1975 | Williams | 324/77 B |
| 3,903,401 | 9/1975 | Jayant | 324/77 B |
| 3,913,013 | 10/1975 | Barley | 324/77 B |
| 3,926,367 | 12/1975 | Bond | 324/77 G |
| 3,942,109 | 3/1976 | Crumly | 324/77 K |
| 3,955,137 | 5/1976 | Harrington | 324/80 |
| 3,971,927 | 7/1976 | Speiser | 324/77 B |
| 3,978,403 | 8/1976 | Mansfield | 324/79 R |
| 3,992,666 | 11/1976 | Edwards | 324/77 R |
| 4,031,462 | 6/1977 | Bouvier | 324/77 B |
| 4,037,152 | 7/1977 | Griffith | 324/79 R |
| 4,118,666 | 10/1978 | Bernstein | 324/77 B |
| 4,253,187 | 2/1981 | Geise | 375/110 |
| 4,253,189 | 2/1981 | Lemoussu | 375/116 |

*Primary Examiner*—Michael J. Tokar
*Attorney, Agent, or Firm*—Bruce R. Mansfield; Paul A. Gottlieb; Michael F. Esposito

[57] ABSTRACT

A frequency-spectrum analyzer with phase-lock for analyzing the frequency and amplitude of an input signal is comprised of a voltage controlled oscillator (VCO) which is driven by a ramp generator, and a phase error detector circuit. The phase error detector circuit measures the difference in phase between the VCO and the input signal, and drives the VCO locking it in phase momentarily with the input signal. The input signal and the output of the VCO are fed into a correlator which transfers the input signal to a frequency domain, while providing an accurate absolute amplitude measurement of each frequency component of the input signal.

8 Claims, 5 Drawing Figures

FREQUENCY SPECTRUM ANALYZER WITH PHASE-LOCK

CONTRACTUAL ORIGIN OF THE INVENTION

The United States Government has rights in this invention pursuant to Contract No. DE-AC07-76IDO1570 between the U.S. Department of Energy and EG&G Idaho, Inc.

BACKGROUND OF THE INVENTION

The present invention relates to systems for analyzing the power distribution of an input signal as a function of frequency and, in particular, to such systems of the sweeping frequency spectrum type. Various arrangements have been proposed for sweep frequency analyzers. Prior arrangements of the heterodyne type beat the incoming signal to a higher frequency, and pass the heterodyned signal through one or more narrow bandwidth filters, such as filters of the third octave type. This arrangement eliminated the reading of harmonics of the input signal, but the resolution of these arrangements was poor, since the filters still had a bandwidth response of a few hertz. Further, such filters had poor transient response and slow scanning rate, owing to their high Q rating.

A second major type of frequency spectrum analyzer, the digital type, typically performs a Fast Fourier Transform (FFT) on the incoming time-based signal. Such processing is not continuous in that digital systems typically employ a sampling process, which is undesirable in many applications where the entire incoming signal must be analyzed. Further, such digital systems, though very rapid, do not operate in true real time since the FFT must be performed on a stored signal and since they perform an analysis of a repetitive event by a sampling process. It is desirable in many instances to perform a continuous analysis of the incoming signal with the time sequence of the events preserved between input and output. Such performance is possible only with a real time analyzer. None of the systems heretofore available have been found to provide an accurate absolute measurement of frequency component amplitudes.

It is therefore an object of the present invention to provide an improved sweep frequency analyzer which performs an accurate absolute frequency strength measurement in real time.

It is another object of the present invention to provide a highly sensitive sweep frequency analyzer having a continuous high resolution measuring capability.

Yet another object of the present invention is to provide a sweep frequency analyzer having a faster scanning rate than prior art analog analyzers.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

These and other objects of the present invention are provided in a sweep frequency analyzer of the analog type. The input signal is fed into a correlator and into a phase error detector circuit. A ramp generator signal and the output of the phase error detector circuit are summed and applied to a Voltage Controlled Oscillator (VCO). The output of the VCO is applied to the correlator, where it is modulated with the input signal, and filtered to provide a frequency domain output signal. The phase error detector circuit compares the phase of the input signal with a 90° phase-shifted VCO signal. The output of the phase error detector drives the VCO such that the output of the VCO is momentarily in-phase with each frequency component of the input signal fed into the correlator. This ensures that the strength of each frequency detected in the analyzer is an accurate absolute measurement of the frequency maximum level.

DESCRIPTION OF THE PREFERRED EMBODIMENT

Figure 1:
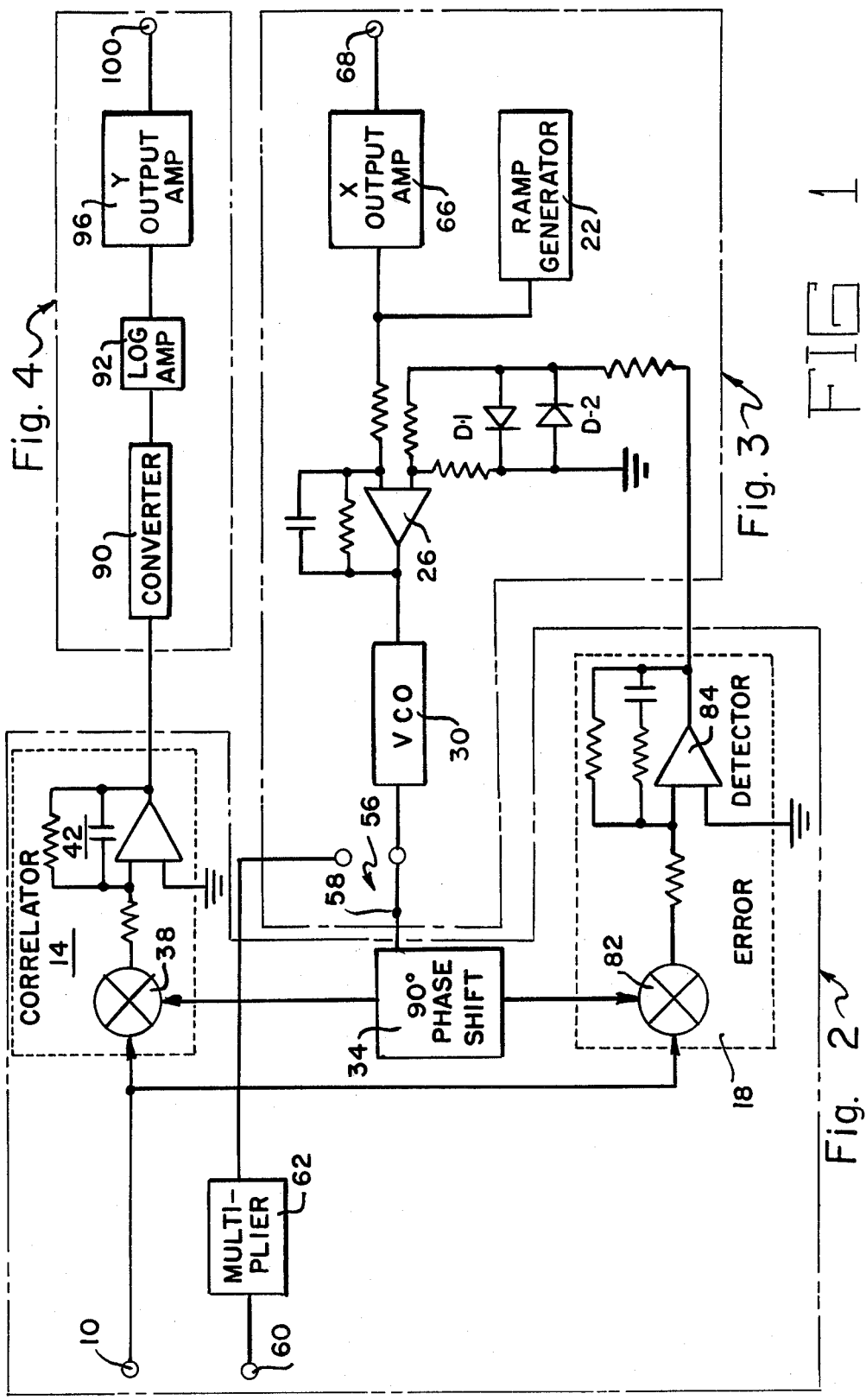
FIG. 1 is a functional block diagram of the analyzer constructed according to the invention.

Referring now to the drawings, FIG. 1 shows a functional block diagram of the analyzer constructed according to the invention. The signal to be analyzed is applied to input terminal 10. Such signals can be taken from a mechanical bearing, a vibrating structural member, or other energy spectrum producer using an accelerometer or the like transducer means. The input signal is applied to a first input of correlator circuit 14 and a first input of error detector circuit 18. The output of error detector 18 is added to the output of a ramp generator circuit 22 in summing amplifier 26 and the resultant sum drives Voltage Controlled Oscillator (VCO) circuit 30. The output of VCO circuit 30 is coupled to a 90° phase-shift circuit 34 to a second input of error detector circuit 18. The output of VCO circuit 30 is also connected to a second input of correlator 14. Error detector circuit 18 measures the difference in phase between the input signal and the 90° phase-shifted VCO output signal.

The analyzer utilizes correlation between a known reference waveform (the output of VCO circuit 30) and unknown input signals. In operation, a time-dependent DC voltage from ramp generator circuit 22 sweeps the frequency output of VCO circuit 30 over a selected decade frequency range. The analyzer incorporates a technique to lock the VCO in phase with each input signal component momentarily as it scans over the selected frequency band. Without phase lock, input signal components would be detected, but the indicated amplitudes would not likely be a measure of the strength of the components detected. That is, measuring errors arise because the phase of the swept oscillator will rarely match the phase of a given input signal component at the instant the two frequencies coincide. However, when the oscillator is locked in phase with each input signal component, the analyzer output is a true measure of the strength of the detected input signal component, and superior sensitivity as well as resolution are realized. The phase lock feature is provided by error detector circuit 18 and phase shifter circuit 34. The reference waveform input to error detector circuit 18 receives a VCO output shifted in-phase 90° by phase shift circuit 34. When the VCO output is matched in phase with the input signal to the analyzer, the error detector output voltage is zero, and the output signal from ramp generator circuit 22, i.e., the input to VCO circuit 30, is unaffected. When the VCO output is not in phase with the input signal to the analyzer, then a positive error voltage is produced if the VCO output lags the input signal in phase. If the VCO output should lead the input signal in phase, then a negative error voltage is produced by error detector 18. These error detector voltages are added to the VCO input, i.e., they are superimposed upon that input such that the VCO is driven by the error detector output in a direction and amount necessary to establish phase locking. The response of the error detector is much faster than the ramp generator input to the VCO, such that with respect to the frequency sweep of the VCO output, phase locking with each input signal component is essentially instantaneous. When the output of VCO circuit 30 and the input signal correspond in frequency, correlator circuit 14 produces an output signal. By noting the frequency of VCO circuit 30 (which gives an output at correlator circuit 14) and by measuring the strength of the correlator output signal, an exact measure of the absolute strength of the particular frequency component of the input signal can be obtained.

With reference to the schematic diagram of FIGS. 2-4, operation of the analyzer will be explained in greater detail. Referring now to FIG. 3, which shows the frequency sweep portion of the analyzer, a voltage controlled oscillator circuit 30 comprises a voltage control oscillator (VCO) 36 which produces a frequency output which is proportional to the level of its DC voltage input. In the preferred embodiment, VCO 36 is an integrated circuit XR-205 manufactured by Exar Integrated Systems. To provide a sweep frequency output, a voltage ramp is applied to an input terminal 37 of VCO 36. The voltage ramp input is provided by a sweep or ramp generator 38 (integrated circuit XR-220 manufactured by Exar Integrated Systems). The output of ramp generator 38 is coupled to VCO 36 through mode selector switch 40a, summing amplifier 26, and transistor Q. The output of VCO 36 appearing at pin 41 is divided in frequency by a divider chain 42 comprising a serial connection of dividers 44-54. Divider 44 is a divide-by-five circuit, whereas dividers 46-54 are divide-by-ten circuits. The outputs of dividers 44-54 are fed into frequency range selector switch 56 which provides six selected decade frequency ranges at its output contact 58. As an alternative to the frequency sweep described above, provision is made to couple an external frequency source through input terminal 60, and squaring multiplier circuit 62 (Burr-Brown Researches, Inc., model type BB 4029/25) to terminal 64 of switch 56. Mode selector switch 40 comprises two portions 40a, 40b. Switch portion 40a as described above couples the output of sweep generator 38 to VCO 36. In its other positions, switch 40a couples a calibration voltage level from variable resistor VRC to VCO 36. Switch portion 40b couples the output of error detector circuit 18 through summing amplifier 26 and transistor Q to VCO 36. Diodes D1 and D2 limit the error detector voltage to about 0.3 volts, so as to limit the amplitude of the superimposed error signal, so that it is exceeded by the sweep ramp voltage within a few seconds. Summing amplifier 26 interfaces all inputs to VCO 36. As has been explained above, summing amplifier 26 permits the voltage ramp input to VCO 36 to be modified, so as to lock the output of VCO 36 in phase with the frequency components of signals applied to input terminal 10.

It is important to keep track of those frequencies which give rise to an analyzer output signal. Accordingly, the output of sweep generator 38 is coupled through X-output amplifier 66 to an X-axis output terminal 68, to which an X-Y chart recorder or the like is connected. Meter M2 is connected to terminal 68 to provide a convenient indication of the frequency of sweep generator 38.

Figure 2:
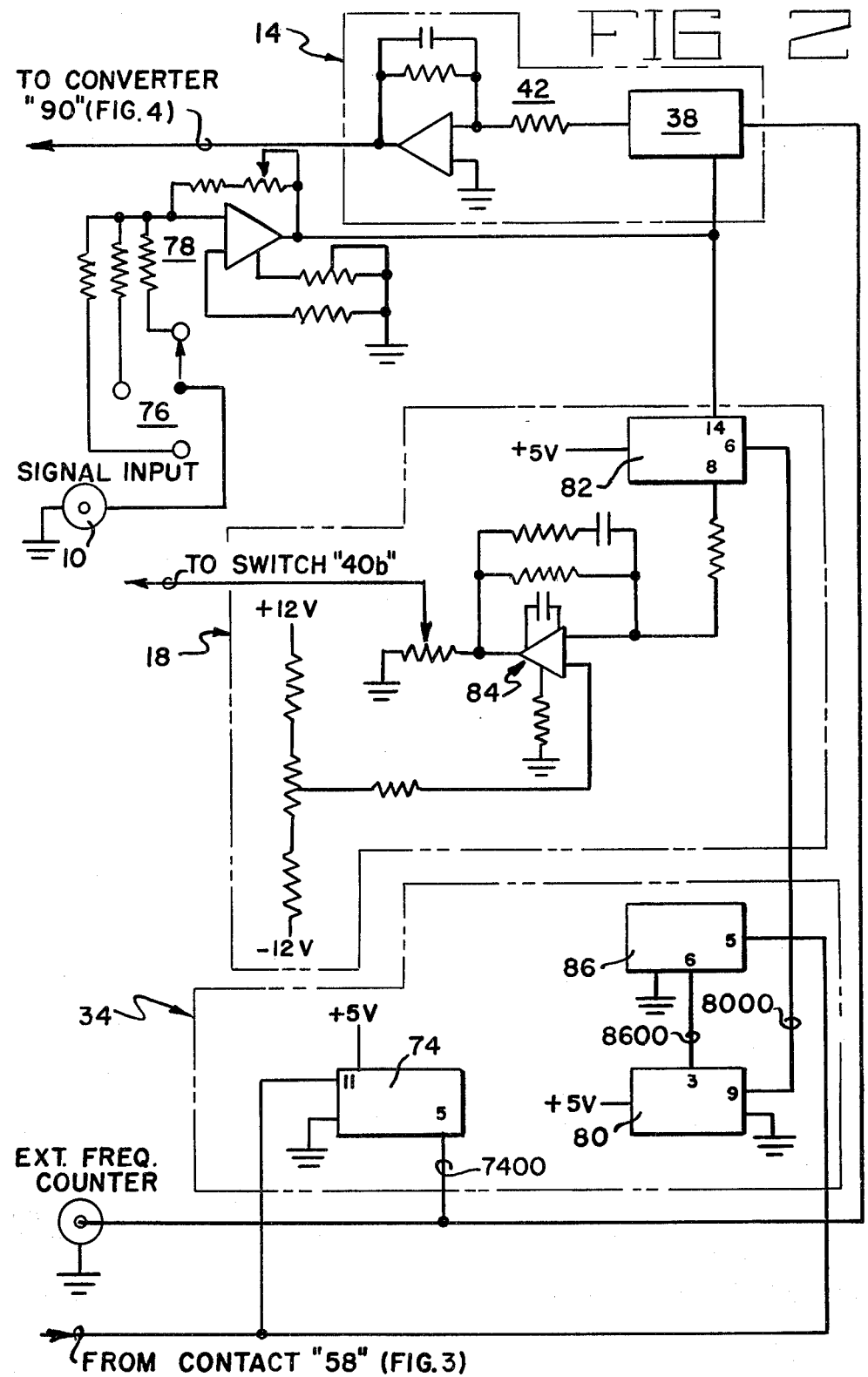
FIGS. 2-4 show a detailed schematic diagram of the analyzer of FIG. 1.
Figure 3:
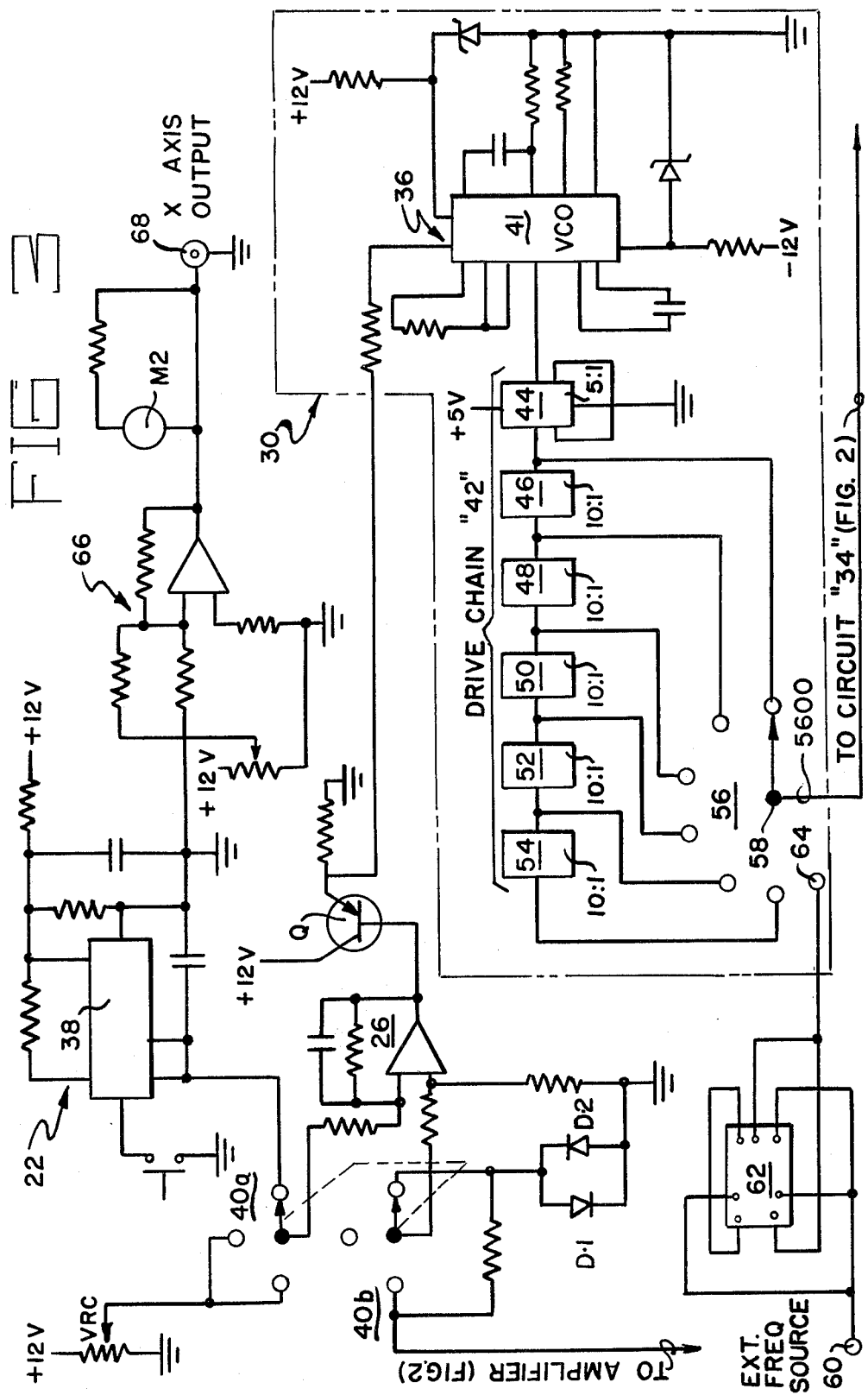

Referring now to FIG. 2, operation of the correlator and error detector circuits will be explained. Correlator circuit 14 performs a Fourier transform of the time domain signal applied to input terminal 10, transforming that signal to its frequency spectrum by modulating the input signal with the output of VCO circuit 30 as provided at contact 58 of switch 56. Correlator circuit 14 comprises a modulator 70, and a filter amplifier 72. The output of VCO circuit 30 appearing at contact 58 of switch 56 is coupled through a bistable multivibrator or flip-flop to modulator 70. A Telex 640-1 solid state switch was used for modulator 70, although similar devices commonly known as phase detectors or synchronous detectors could also be used.

The input signal applied to terminal 10 is coupled to a second input of modulator 70 through a gain control 76 and a preamplifier 78. The VCO circuit output and the input signal are modulated in modulator 70 and the output is connected to a low-pass filter amplifier 72. The correlator 14 changes the time domain input signal applied to terminal 10 to a frequency domain signal according to the following principals. The input signal applied to terminal 10, $e_s$, and VCO output signal $e_r$ appearing at contact 58 of switch 56, are sine waves of the form:

$$e_s = E_s \cos \omega_s t$$

and $$e_r = E_r \cos(\omega_r t + \theta)$$

The output of modulator 70 is:

$$e_m = E_s \cos \omega_s t [E_r \cos(\omega_r t + \theta)] =$$

$$\frac{E_s E_r \cos}{2}[(\omega_s - \omega_r)t - \theta] + \frac{E_s E_r \cos}{2}[(\omega_s + \omega_r)t + \theta]$$

If $\omega_r = \omega_s$, then $$e_m = \frac{E_s E_r \cos \theta}{2} + \frac{E_s E_r \cos(2\omega_s t + \theta)}{2}$$

The low pass filter 42 removes the second harmonic term leaving the output of correlator 14:

$$E_c = \frac{E_s E_r \cos \theta}{2} = K E_s \cos \theta \text{ (for } E_r = \text{constant)}$$

It can be seen that the correlator output is a function only of the amplitude of the input signal and the phase difference between the reference waveform of the VCO circuit and the input signal. If the reference waveform is locked in phase with the input signal ($\omega_r = \omega_s$), the phase angle is zero and the correlator output is determined only by the strength (amplitude) of the input signal.

Referring again to FIG. 2, the error detector circuit 18 comprises modulator 82 and error amplifier/filter 84. The output of VCO circuit 30 appearing at contact 58 of switch 56 is coupled to modulator 82 through phase inverter 86 and flip-flop 88, both of which comprise a portion of the 90° phase shifter circuit 34 as will be explained later. Modulator 82 also receives the amplified input signal at a second input. Modulator 82, which is identical to modulator 70, modulates the inverted VCO output and the input signal. The output of modulator 82 is coupled through amplifier 84, mode selector switch 40b and transistor Q, to VCO 36. The error detector circuit 18 is similar to correlator circuit 14, except that its reference waveform is shifted 90° so that its output is:

$$E_e = \frac{E_s E_r \sin\theta}{2} = KE_s \sin\theta$$

When the reference waveform and the input signal are matched in phase, the correlator output is maximum and the error detector output is zero, i.e., the error voltage is zero. The error voltage is maximum when the phase difference is ± 90°. This voltage is positive when the reference signal lags the input signal, and is negative when the reference signal leads the input signal. When applied to VCO 36, the polarity of the error voltage is such that it drives VCO 36 in the direction necessary to establish phase locking with the input signal.

Figure 4:
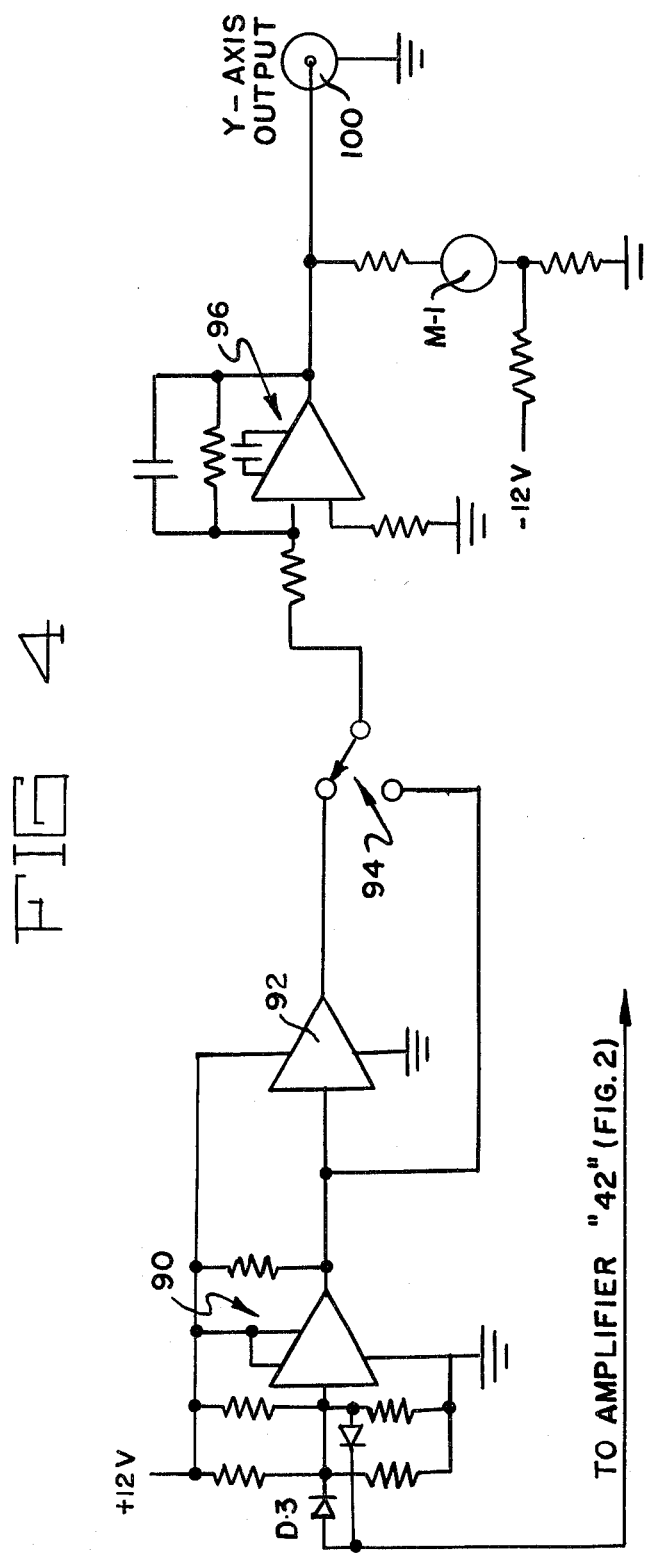

With reference to FIG. 4, the balance of the analyzer circuit will be described. The output of correlator 14, appearing at the output of filter amplifier 72, is fed into amplifier 90 which converts the bipolar waveform of correlator 14 to a unipolar waveform, thus affording greater resolution in the chart recording of the output signnal. The output of amplifier 90 is connected to amplifier 92 which converts the linear signal of amplifier 90 to a logarithmically compressed signal which is coupled through selector switch 94 to output amplifier 96. Output amplifier 96 is connected to two means for indicating the signal strength of the detected signal component. The first indicator means is an X-Y chart recorder or the like, coupled through terminal 100 and the second indicator means, meter M-1, provides a convenient indication of signal strength.

Operation of those portions of the analyzer not set forth above will now be explained. An input signal is applied to terminal 10, and is coupled through a preamplifier to modulators 70, 82 of correlator 14 and error detector circuits 18, respectively.

Ramp generator 38 provides a positive-going 0–5 volt DC ramp. When applied to VCO 36 through summing amplifier 26, the ramp signal causes the VCO output frequency to sweep over a one decade range, from 10 to 100 Khz. In the preferred embodiment, VCO circuit 30 operates over a range of 20 Khz to 200 Khz, a range which provides added tracking stiffness without incurring high gain amplifier noise. Decade frequency dividers 44–54 shown in FIG. 3 divide the output of VCO 30 over six decades from 0.02 Khz to 20 Khz. The ramp voltage is also used to drive the X-axis motor of an X-Y recorder used to display the frequency spectrum of the input signal. Since the X-axis output frequency is a linear function of the ramp voltage, the recorder X-axis output is calibrated to indicate sweep frequency.

Figure 5:
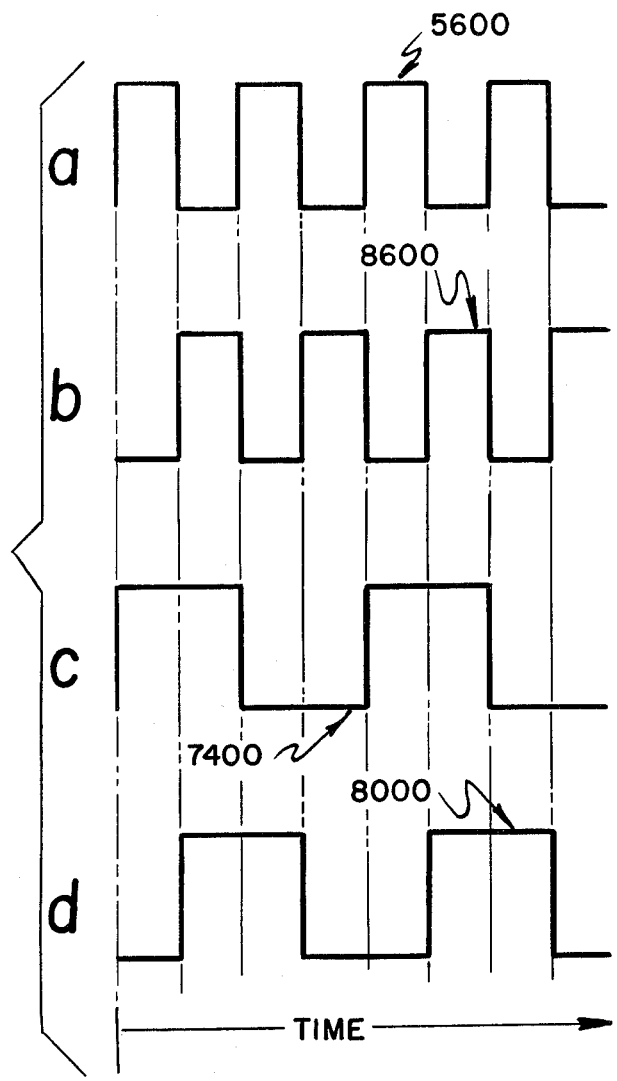
FIG. 5 shows various wave forms appearing in the analyzer circuitry.

The sweep frequency output of VCO circuit 30, waveform 5600 of FIG. 5, is connected to correlator modulator 70, and is coupled through phase invertor 86 to error detector modulator 82. Waveform 5600 of FIG. 5, the output of VCO 30 appearing at contact 58 of switch 56, is twice the frequency of the reference signal required for modulators 38, 82. Waveform 5600 is fed through phase invertor 86 to produce waveform 8600 of FIG. 5 and then through bistable multivibrator 74 to produce waveform 7400 of FIG. 5. The bistable multivibrator 74 has the frequency of waveform 5600. Waveform 8600 is in turn fed through bistable multivibrator 80 to produce waveform 8000, which is one-half the frequency of waveform 5600. It can be seen that the reference waveform 8000 for the error detector modulator 82 is in quadrature with the reference waveform 7400 for the correlator modulator 70. This method of obtaining a 90° phase shift assures an exact 90° phase displacement, regardless of the frequency at which the analyzer is operating, since reactive components are not used. Error detector circuit 18 compares the phases of the input signal and VCO output signal, and produces a voltage proportional to the phase difference. The error detector output is zero when there is no periodic or coherent signal. As the VCO frequency approaches a signal component frequency, an error voltage develops, causing the VCO to pull in phase with the input signal. Limiting diodes D1, D2 limit the error voltage maximum and minimum to approximately 0.3 volts so that the ramp voltage exceeds the error voltage shortly after phase locking takes place. The ramp voltage rises at a rate of 0.033 volts/second whereas the error voltage rises more rapidly, 1.0 volt/second, such that phase locking is rapid and the overall scanning time is essentially unchanged.

The embodiments of this invention in which an exclusive property or privilege is claimed are defined as follows:

1. A sweep frequency spectrum analyzer for determining the frequency spectrum components of an input signal comprising:
   a cross correlator means having first and second input means and an output means;
   a phase detector means having first and second input means and producing an error signal at an output means;
   sweep frequency means having an input means for coupling to an error signal, said sweep frequency means responsive to said error signal to produce a sweep frequency signal whose frequency is proportional to said error signal;
   means for coupling the input signal to said first input means of said cross correlator means and said phase detector means;
   means for coupling said sweep frequency signal to said second input means of said said cross correlator means and said phase detector means;
   means for coupling said input of said sweep frequency means to said error signal of said phase detector means;
   said phase detector means and said sweep frequency means comprising a phase lock loop which matches the phase of the sweep frequency signal to the phase of said input signal for a predetermined time period; and
   said cross correlator output means producing during said predetermined time period, an output signal which is directly proportional to the maximum amplitude of a frequency spectrum component of said input signal.

2. The arrangement of claim 1 wherein said phase detector comprises:
- a modulator means having a first input means connected to said first input of said phase detector, a second input means, and an output means;
- a 90° phase shift means coupled between said second input of said phase detector and said second input means of said modulator means; and
- said output means coupled to said sweep frequency means such that said phase detector and said sweep frequency means form a phase lock loop in which said sweep frequency signal coupled to said correlator is locked in phase with said input signal.

3. The arrangement of claim 1 wherein said 90° phase shift means comprises:
- doubling means producing a doubling signal which is twice the frequency of said sweep frequency output signal;
- phase inverter means producing a phase inverter signal by inverting the phase of said doubling signal;
- first halving means for producing a first frequency halving signal by halving the frequency of said phase inverter signal;
- means connecting said first frequency halving signal to said second input means of said modulator;
- second halving means producing a second frequency halving signal which is half the frequency of said doubling signal connected to said second input means of said cross correlator whereby said second input means of said first correlator is connected to a signal which is in phase with said sweep frequency output signal, and said second input of said modulator is connected to a signal which is in quadrature with said sweep frequency output signal.

4. The arrangement of claim 3 wherein said means for producing said first and said second frequency halving signals comprise bistable multivibrators.

5. The arrangement of claim 4 wherein said sweep frequency means comprises:
- a signal summing means, a ramp generator means producing a driving signal, and a voltage controlled oscillator having an oscillator input means, said driving signal coupled through said summing means to said oscillator input so that said voltage controlled oscillator is driven by said ramp generator means, said sweep frequency means further comprising means for introducing said error signal from said phase detector into said summing means such that said error signal from said phase detector output is superimposed upon said ramp generator driving signal, so as to drive said voltage controlled oscillator with said error signal.

6. The arrangement of claim 5 further comprising frequency decade divider means coupled between said doubling means and said halving means and between said doubling means and said second halving means for selectively dividing said sweep frequency output signal.

7. The arrangement of claim 6 further comprising converting means coupled to said cross correlator output means for converting a bi-polar signal to a unipolar signal.

8. The arrangement of claim 1 further comprising readout means having a first input means coupled to said cross correlator output means and responding to said output signal to produce an indication of said maximum amplitude of said frequency spectrum component during said predetermined time period.

* * * * *